(12) United States Patent
Sharf et al.

(10) Patent No.: US 11,152,750 B2
(45) Date of Patent: Oct. 19, 2021

(54) CORNER EMI SPRINGS FOR A RECEPTACLE CAGE

(71) Applicant: TE Connectivity Services GmbH, Schaffhausen (CH)

(72) Inventors: Alex Michael Sharf, Harrisburg, PA (US); Richard James Long, Columbia, PA (US); Steven David Dunwoody, Middletown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/817,093

(22) Filed: Mar. 12, 2020

(65) Prior Publication Data

US 2021/0288447 A1    Sep. 16, 2021

(51) Int. Cl.
*H01R 13/6582*    (2011.01)

(52) U.S. Cl.
CPC ............................ *H01R 13/6582* (2013.01)

(58) Field of Classification Search
CPC .............. H01R 13/6582–6584; H01R 13/6596
USPC ................ 439/607.17–607.21, 607.28–607.3
See application file for complete search history.

(56) References Cited

U.S. PATENT DOCUMENTS

| | | | | |
|---|---|---|---|---|
| 6,095,862 A * | 8/2000 | Doye | ................. | H01R 13/6594 439/607.11 |
| 6,206,730 B1 * | 3/2001 | Avery | ................. | H01R 12/724 439/607.18 |
| 7,455,554 B2 * | 11/2008 | Long | .................... | G02B 6/4256 439/607.17 |
| 7,928,324 B2 | 4/2011 | Moore | | |
| 9,413,115 B1 * | 8/2016 | Henry | ................ | H01R 13/6581 |
| 9,615,492 B2 * | 4/2017 | Brodsky | .............. | H05K 9/0015 |
| 9,666,995 B1 * | 5/2017 | Phillips | ................ | G02B 6/4277 |
| 9,728,919 B1 * | 8/2017 | Dunwoody | ........ | H01R 13/6582 |
| 9,935,403 B1 * | 4/2018 | Briant | ................ | H01R 13/6583 |
| 2003/0161108 A1 * | 8/2003 | Bright | .................. | G02B 6/4277 361/707 |
| 2006/0068639 A1 * | 3/2006 | Barringer | ............. | H05K 9/0058 439/607.01 |
| 2007/0128937 A1 * | 6/2007 | Long | .................... | H05K 9/0016 439/607.01 |
| 2016/0322757 A1 * | 11/2016 | Liu | ..................... | H01R 13/6583 |

* cited by examiner

*Primary Examiner* — Gary F Paumen

(57) ABSTRACT

A receptacle cage assembly includes a receptacle cage having first and second side walls extending from a top wall at first and second corners. A gasket has EMI springs electrically connected to the receptacle cage and a panel in a panel opening including top EMI springs and first and second side EMI springs. A first corner EMI spring is located outward of the first corner of the receptacle cage to engage the panel at a first corner of the panel opening. A second corner EMI spring is located outward of the second corner of the receptacle cage to engage the panel at a second corner of the panel opening.

19 Claims, 6 Drawing Sheets

US 11,152,750 B2

CORNER EMI SPRINGS FOR A RECEPTACLE CAGE

BACKGROUND OF THE INVENTION

The subject matter herein relates generally to receptacle cages.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. The receptacle cages are typically arranged at an interface of another component, such as through an opening in a panel or bezel. Conventional receptacle cages have gaskets at the interface with the panel to electrically connect the receptacle cage to the panel. However, conventional communication systems have performance problems, particularly when transmitting at high data rates. For instance, gaskets of known communication systems are leakage areas for EMI.

A need remains for a receptacle cage having improved electrical shielding.

BRIEF DESCRIPTION OF THE INVENTION

In one embodiment, a receptacle cage assembly is provided for a communication system including a receptacle cage and a gasket. The receptacle cage includes cage walls including a top wall, a first side wall extending from the top wall at a first corner, and a second side wall extending from the top wall at a second corner opposite the first corner. The top wall, the first side wall, and the second side wall form a module channel configured to receive a pluggable module. The cage walls extend between a front end and a rear end of the receptacle cage. The receptacle cage is configured to be received in a panel opening of a panel with the front end forward of the panel and the rear end rearward of the panel. The module channel receives the pluggable module at the front end. The gasket is provided at the front end. The gasket has EMI springs electrically connected to the receptacle cage and configured to be electrically connected to the panel in the panel opening. The EMI springs include top EMI springs electrically connected to the top wall, first side EMI springs electrically connected to the first side wall, and second side EMI springs electrically connected to the second side wall. Each EMI spring has a base and a distal end opposite the base with a deflectable portion between the base and the distal end. The base is provided at the corresponding cage wall. The distal end engages the corresponding cage wall. The deflectable portion is spaced apart from the cage wall and is deflectable toward the cage wall. The receptacle cage assembly includes first and second corner EMI springs. The first corner EMI spring is located outward of the first corner of the receptacle cage. The first corner EMI spring has a first corner EMI spring mating interface configured to engage the panel at a first corner of the panel opening. The second corner EMI spring is located outward of the second corner of the receptacle cage. The second corner EMI spring has a second corner EMI spring mating interface configured to engage the panel at a second corner of the panel opening.

In an embodiment, a receptacle cage assembly is provided for a communication system including a receptacle cage having cage walls including a top wall, a first side wall extending from the top wall at a first corner, and a second side wall extending from the top wall at a second corner opposite the first corner. The top wall, the first side wall, and the second side wall form a module channel configured to receive a pluggable module. The cage walls extend between a front end and a rear end of the receptacle cage. The receptacle cage is configured to be received in a panel opening of a panel with the front end forward of the panel and the rear end rearward of the panel. The receptacle cage includes a first corner EMI spring integral with the cage walls and located outward of the first corner. The receptacle cage includes a second corner EMI spring integral with the cage walls and located outward of the second corner. The first corner EMI spring has a first corner EMI spring mating interface configured to engage the panel at a first corner of the panel opening. The second corner EMI spring has a second corner EMI spring mating interface configured to engage the panel at a second corner of the panel opening. The receptacle cage assembly includes a gasket at the front end having EMI springs electrically connected to the receptacle cage and configured to be electrically connected to the panel in the panel opening. The EMI springs include top EMI springs electrically connected to the top wall, first side EMI springs electrically connected to the first side wall, and second side EMI springs electrically connected to the second side wall. Each EMI spring has a base and a distal end opposite the base with a deflectable portion between the base and the distal end. The base is provided at the corresponding cage wall. The distal end engages the corresponding cage wall. The deflectable portion is spaced apart from the cage wall and being deflectable toward the cage wall. The first corner EMI spring is located between the first side EMI springs and the top EMI springs and the second corner EMI spring located between the second side EMI springs and the top EMI springs.

In an embodiment, a receptacle cage assembly is provided for a communication system including a receptacle cage having cage walls including a top wall, a first side wall extending from the top wall at a first corner, and a second side wall extending from the top wall at a second corner opposite the first corner. The top wall, the first side wall, and the second side wall form a module channel configured to receive a pluggable module. The cage walls extend between a front end and a rear end of the receptacle cage. The receptacle cage is configured to be received in a panel opening of a panel with the front end forward of the panel and the rear end rearward of the panel. The module channel receives the pluggable module at the front end. The receptacle cage assembly includes a gasket at the front end having EMI springs electrically connected to the receptacle cage and configured to be electrically connected to the panel in the panel opening. The EMI springs include top EMI springs electrically connected to the top wall including a left-most top EMI spring and a right-most top EMI spring. The EMI springs include first side EMI springs electrically connected to the first side wall including an upper-most first side EMI spring. The EMI springs include second side EMI springs electrically connected to the second side wall including an upper-most second side EMI spring. Each EMI spring has a base and a distal end opposite the base with a deflectable portion between the base and the distal end. The base is provided at the corresponding cage wall. The distal end engages the corresponding cage wall. The deflectable portion is spaced apart from the cage wall and is deflectable toward the cage wall. The receptacle cage assembly includes a first corner EMI spring located outward of the first corner of the receptacle cage. The first corner EMI spring includes a first spring member extending from the left-most top EMI spring and a second spring member extending from the upper-most first side EMI spring. The first spring member has a first spring member mating interface configured to engage the panel at a first corner of the panel opening. The second spring member has a second spring member mating interface configured to engage the panel at the first corner of the panel opening. The receptacle cage assembly includes a second corner EMI spring located outward of the second corner of the receptacle cage. The second corner EMI spring includes a third spring member extending from the right-most top EMI spring and a fourth spring member extending from the upper-most second side EMI spring. The third spring member has a third spring member mating interface configured to engage the panel at a second corner of the panel opening. The fourth spring member has a fourth spring member mating interface configured to engage the panel at the second corner of the panel opening.

In an embodiment, a communication system is provided including a panel, a receptacle cage and a gasket. The panel includes a front surface and a rear surface. The panel has a panel opening including an upper edge, a first side edge, a second side edge and a lower edge. The first and second side edges extend between the upper edge and the lower edge. The panel opening has a first corner at the intersection of the first side edge and the upper edge and a second corner at the intersection of the second side edge and the upper edge. The receptacle cage has cage walls including a top wall, a first side wall extending from the top wall at a first corner received in the first corner of the panel opening, and a second side wall extending from the top wall at a second corner received in the second corner of the panel opening. The top wall, the first side wall, and the second side wall form a module channel configured to receive a pluggable module. The cage walls extend between a front end and a rear end of the receptacle cage. The receptacle cage is received in the panel opening with the front end forward of the front surface of the panel and the rear end rearward of the rear surface of the panel. The gasket is provided at the front end. The gasket has EMI springs electrically connected to the receptacle cage and electrically connected to the panel in the panel opening. The EMI springs include top EMI springs electrically connected to the top wall and engaging the upper edge of the panel. The EMI springs have first side EMI springs electrically connected to the first side wall and engaging the first side edge of the panel. The EMI springs have second side EMI springs electrically connected to the second side wall and engaging the second side edge of the panel. Each EMI spring has a base and a distal end opposite the base with a deflectable portion between the base and the distal end. The base is provided at the corresponding cage wall. The distal end engages the corresponding cage wall. The deflectable portion is spaced apart from the cage wall and is deflectable toward the cage wall. A first corner EMI spring is located outward of the first corner of the receptacle cage. The first corner EMI spring has a first corner EMI spring mating interface engaging the first corner of the panel. A second corner EMI spring is located outward of the second corner of the receptacle cage. The second corner EMI spring has a second corner EMI spring mating interface engaging the second corner of the panel.

DETAILED DESCRIPTION OF THE INVENTION

Figure 1:
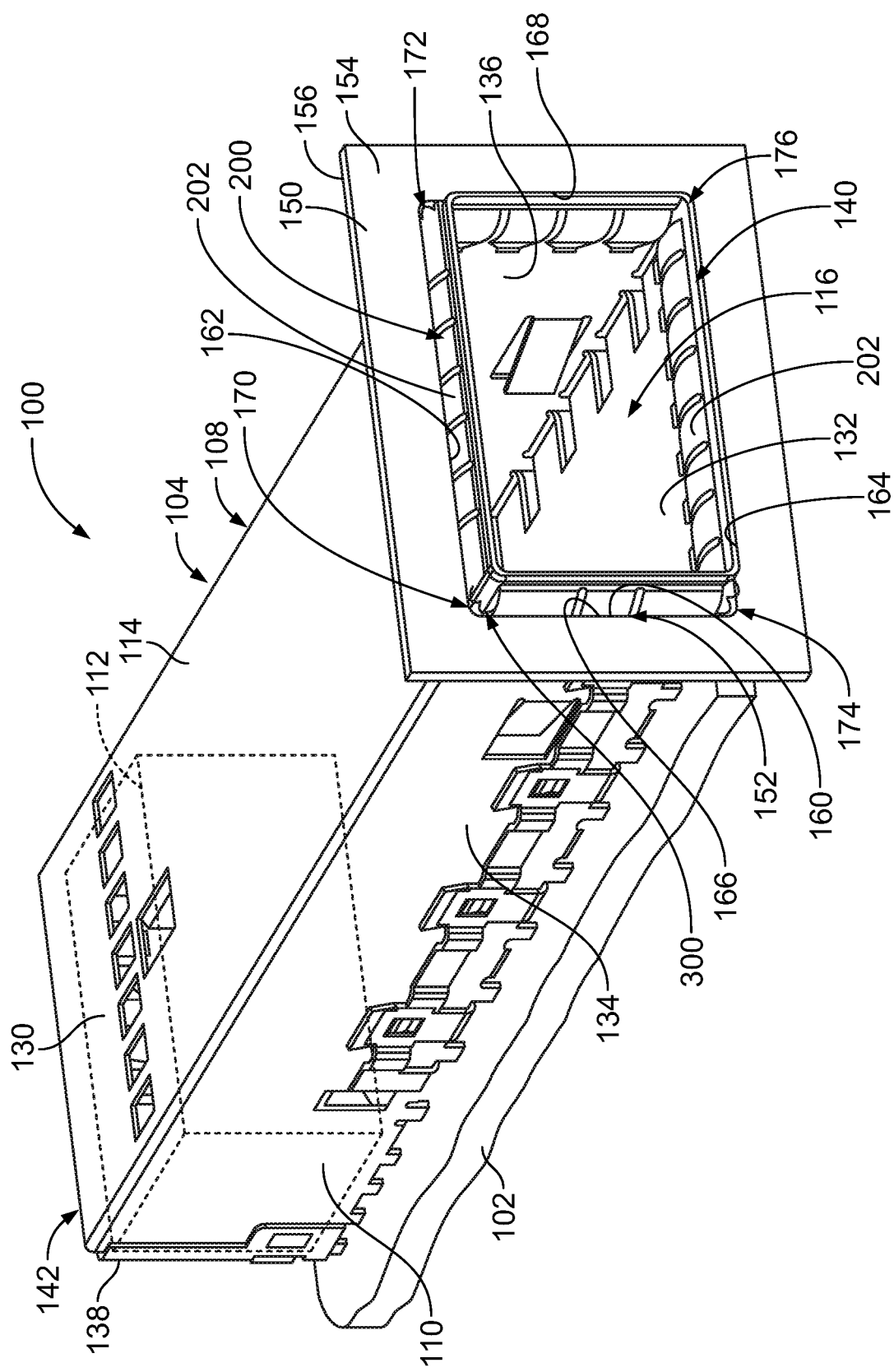
FIG. 1 is a front perspective view of a communication system formed in accordance with an exemplary embodiment.
Figure 2:
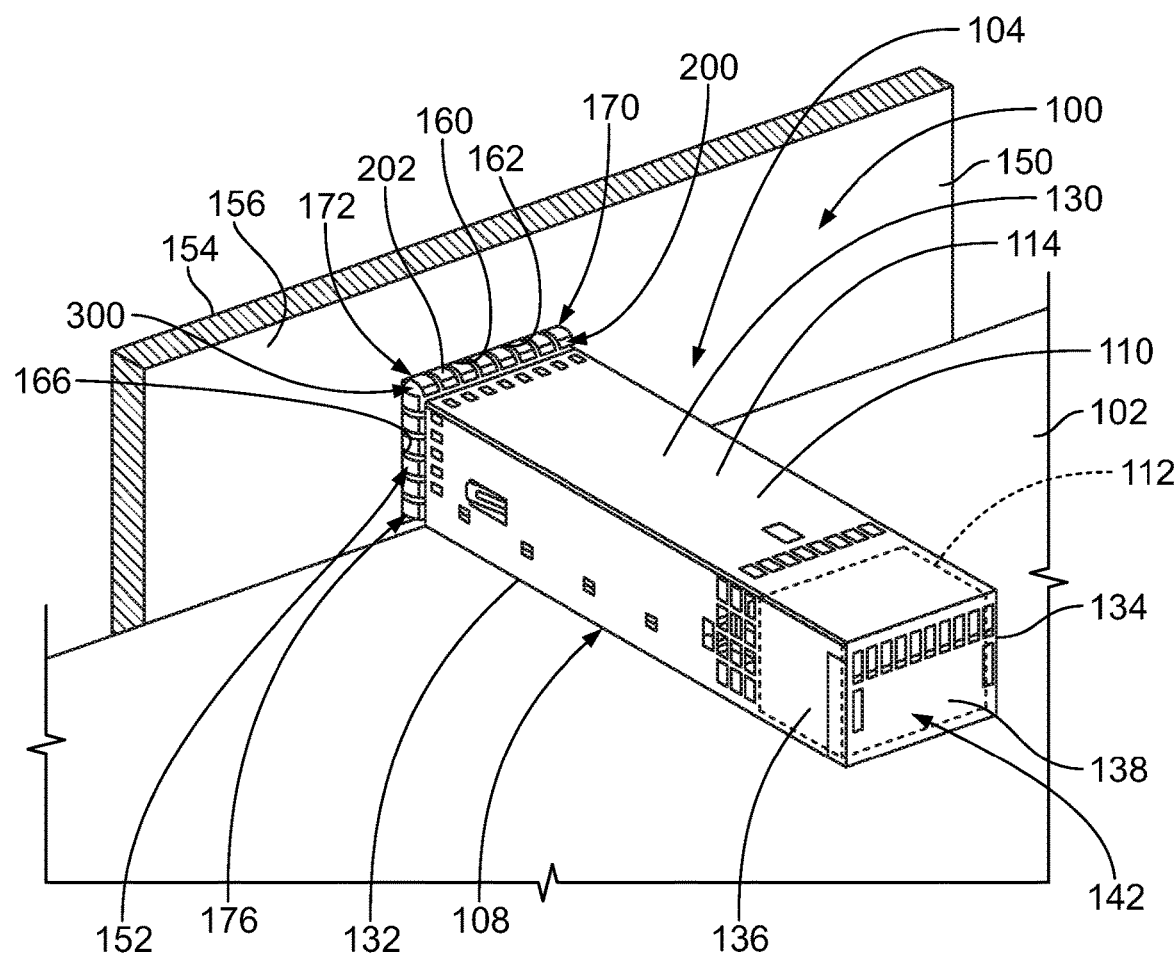
FIG. 2 is a rear perspective view of the communication system formed in accordance with an exemplary embodiment.

FIG. 1 is a front perspective view of a communication system 100 formed in accordance with an exemplary embodiment. FIG. 2 is a rear perspective view of the communication system 100 formed in accordance with an exemplary embodiment. The communication system 100 includes a circuit board 102 and a receptacle connector assembly 104 mounted to the circuit board 102. A pluggable module 106 (shown in FIG. 3) is configured to be electrically connected to the receptacle connector assembly 104. The pluggable module 106 is electrically connected to the circuit board 102 through the receptacle connector assembly 104.

In an exemplary embodiment, the receptacle connector assembly 104 includes a receptacle cage assembly 108 and a communication connector 112 (shown in phantom) adjacent the receptacle cage assembly 108. For example, in the illustrated embodiment, the communication connector 112 is received in the receptacle cage assembly 108. In other various embodiments, the communication connector 112 may be located rearward of the receptacle cage assembly 108. In an exemplary embodiment, the receptacle cage assembly 108 includes a receptacle cage 110 and a gasket 200 electrically coupled to the receptacle cage 110. The gasket 200 may be integral with the receptacle cage 110, such as being stamped from the receptacle cage 110 in various embodiments. In other embodiments, the gasket 200 may be separate and discrete from the receptacle cage 110, being welded or clipped to the receptacle cage 110 to electrically connect the gasket 200 to the receptacle cage 110. The gasket 200 includes EMI springs 202 providing EMI shielding around the receptacle cage 110. In an exemplary embodiment, the receptacle cage assembly 108 includes corner EMI springs 300 at the corners of the receptacle cage 110. The corner EMI springs 300 provide shielding at the corners, such as between the EMI springs along the top of the receptacle cage 110 and the EMI springs along the sides of the receptacle cage 110.

In various embodiments, the receptacle cage 110 is enclosed and provides electrical shielding for the communication connector 112. The receptacle cage 110 is configured to surround at least a portion of the pluggable module 106 to provide shielding for the pluggable module 106. The receptacle cage 110 includes a plurality of cage walls 114 that define one or more module channels for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the cage walls 114 being shielding walls.

In the illustrated embodiment, the receptacle cage 110 includes a single module channel 116 for receiving a single pluggable module 106. The receptacle cage 110 has a port that is open at the front of the receptacle cage 110 to receive the pluggable module 106. Any number of module channels may be provided in various embodiments. For example, the receptacle cage 110 may constitute a stacked cage member having upper and lower module channels 116 to receive multiple pluggable modules 106 in a stacked arrangement in an alternative embodiment. The upper and lower module channels 116 may be arranged in a single column; however, the receptacle cage 110 may include multiple columns of ganged module channels 116 in alternative embodiments (for example, 2×2, 3×2, 4×2, 4×3, etc.). In other various embodiments, rather than being a stacked cage member, the receptacle cage 110 may include ganged module channels 116 in a single row (for example, 1×2, 1×4, etc.). Optionally, multiple communication connectors 112 may be arranged within the receptacle cage 110, such as when multiple columns or rows of module channels 116 are provided.

In an exemplary embodiment, the cage walls 114 of the receptacle cage 110 include a top wall 130, a bottom wall 132, a first side wall 134, a second side wall 136 and a rear wall 138. The bottom wall 132 may rest on the circuit board 102. However, in alternative embodiments, the receptacle cage 110 may be provided without the bottom wall 132. The receptacle cage 110 extends between a front end 140 and a rear end 142. The ports is provided at the front end 140 to receive the pluggable module 106 through the front end 140. The cage walls 114 define a cavity. For example, the cavity may be defined by the top wall 130, the bottom wall 132, the side walls 134, 136 and the rear wall 138. The cavity defines the module channel 116 that receives the pluggable module 106. The cavity receives the communication connector 112. Other cage walls 114 may separate or divide the cavity into a plurality of module channels 116, such as stacked or ganged module channels. For example, the cage walls 114 include a divider (not shown). The divider may be a horizontal divider positioned between upper and lower module channels 116. In other various embodiments, the divider may define a vertical separator panel (not shown), such as parallel to the side walls 134, 136.

In an exemplary embodiment, the receptacle connector assembly 104 may include one or more heat sinks (not shown) for dissipating heat from the pluggable modules 106. For example, the heat sink may be coupled to the top wall 130 for engaging the upper pluggable module 106 received in the upper module channel 116. The heat sink may extend through an opening in the top wall 130 to directly engage the pluggable module 106. Other types of heat sinks may be provided in alternative embodiments.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity to interface with the pluggable module(s) 106. For example, the rear wall 138 may include an opening to receive components therethrough.

In an exemplary embodiment, the pluggable modules 106 are loaded into the receptacle cage 110 through the front end 140 to mate with the communication connector 112. The shielding cage walls 114 of the receptacle cage 110 provide electrical shielding around the communication connector 112 and the pluggable modules 106, such as around the mating interfaces between the communication connector 112 and the pluggable modules 106. The gasket 200 may interface with the pluggable modules 106 to electrically connect the receptacle cage 110 to the pluggable modules 106 and to close any gaps between the pluggable modules 106 and the receptacle cage 110 to prevent EMI leakage through such gaps. The communication connector 112 is coupled to the circuit board 102. The receptacle cage 110 is mounted to the circuit board 102 over the communication connector 112.

In an exemplary embodiment, the gasket 200 is provided at the front end 140 for providing electrical shielding for the receptacle cage 110. In an exemplary embodiment, the gasket 200 is configured to electrically connect with the pluggable module 106 received in the corresponding module channel 116. The gasket 200 is configured to engage a panel 150 to electrically connect the receptacle cage 110 to the panel 150. For example, the front end 140 of the receptacle cage 110 extends through a panel opening 152 in the panel 150 such that the front end 140 is forward of a front surface 154 of the panel 150 and the rear end 142 is rearward of a rear surface 156 of the panel 150. The gasket 200 prevents EMI leakage through the panel opening 152.

The EMI springs 202 of the gasket 200 are configured to engage panel edges 160 of the panel 150 defining the panel opening 152. For example, the EMI springs 202 are configured to interface with an upper edge 162, a lower edge 164, a first side edge 166 and a second side edge 168 of the panel opening 152. The panel opening 152 may have other shapes other than the rectangular shape illustrated in FIGS. 1 and 2 in alternative embodiments defined by greater or fewer panel edges 160. The EMI springs 202 may be compressed within the panel opening 152 by the panel edges 160. In an exemplary embodiment, the corner EMI springs 300 are configured to engage the panel edges 160 of the panel 150. For example, the corner EMI springs 300 may engage the panel 150 at a first corner 170 and/or a second corner 172 and/or a third corner 174 and/or a fourth corner 176. The corner EMI springs 300 provide shielding at the corners 170, 172, 174, 176 between the EMI springs 202.

Figure 3:
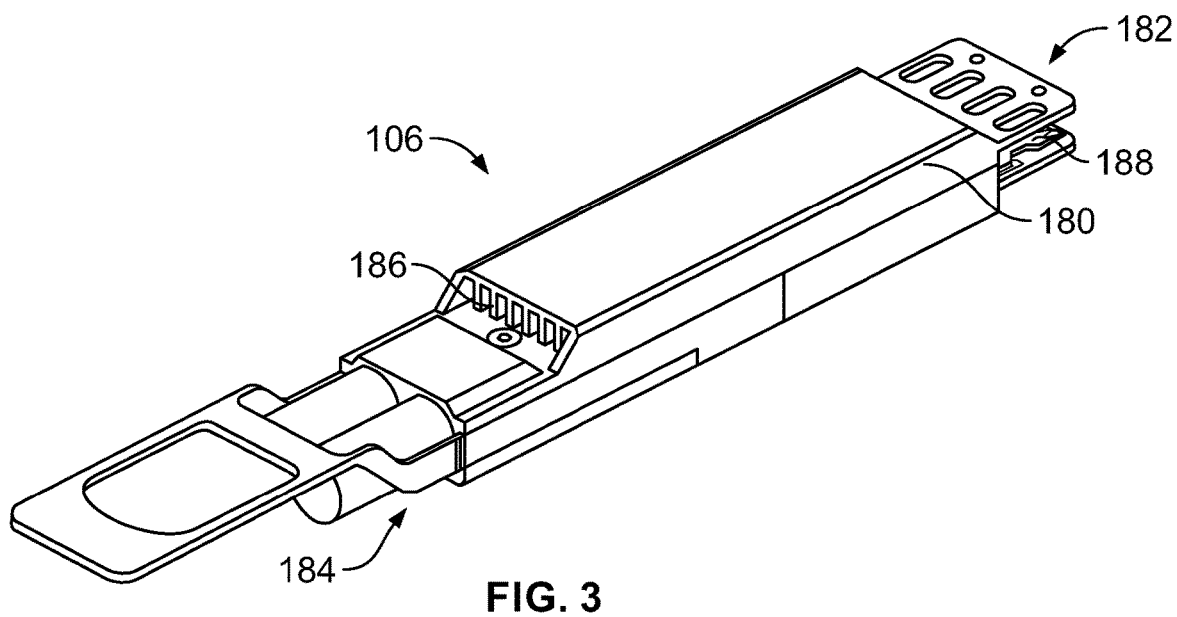
FIG. 3 is a rear perspective view of a pluggable module of the communication system in accordance with an exemplary embodiment.

FIG. 3 is a rear perspective view of the pluggable module 106 in accordance with an exemplary embodiment. The pluggable module 106 has a pluggable body 180, which may be defined by one or more shells. The pluggable body may be thermally conductive and/or may be electrically conductive, such as to provide EMI shielding for the pluggable module 106. The pluggable body 180 includes a mating end 182 and an opposite front end 184. The front end 184 may be a cable end having a cable extending therefrom to another component within the system. The mating end 182 is configured to be inserted into the corresponding module channel 116 (shown in FIG. 1). In an exemplary embodiment, exterior surface of the pluggable body 180, such as sides, the top, the bottom, may be engaged by the gasket 200 (shown in FIG. 1).

The pluggable module 106 includes a module circuit board 188 that is configured to be communicatively coupled to the communication connector 112 (shown in FIG. 1). The module circuit board 188 may be accessible at the mating end 182. The module circuit board 188 may include components, circuits and the like used for operating and/or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a plurality of heat transfer fins 186 along at least a portion of the pluggable module 106. The fins 186 transfer heat away from the main shell of the pluggable body 180, and thus from the module circuit board 188 and associated components. In the illustrated embodiment, the fins 186 are parallel plates that extend lengthwise; however, the fins 186 may have other shapes in alternative embodiments, such as cylindrical or other shaped posts.

Figure 4:
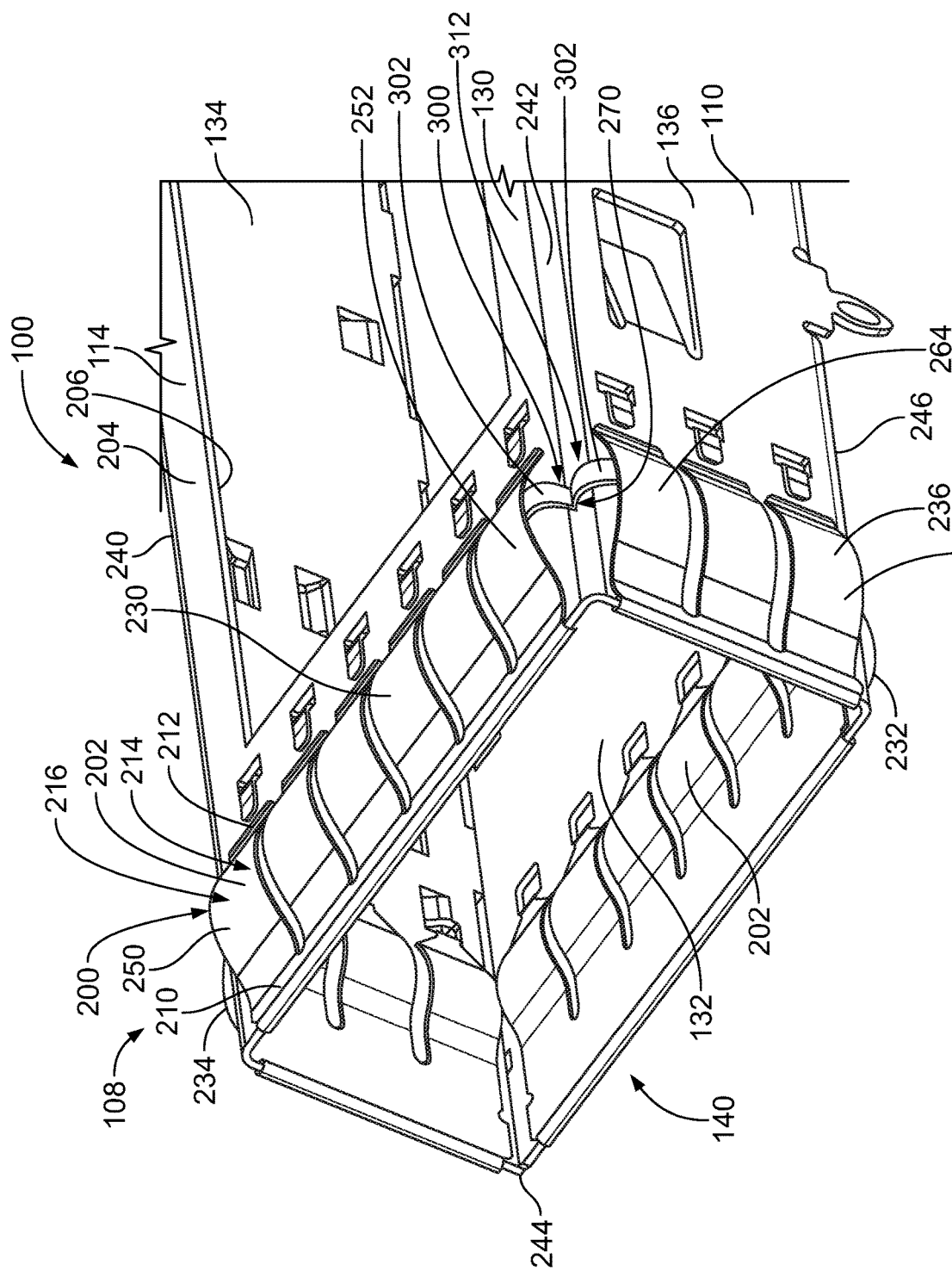
FIG. 4 is a front perspective view of a portion of the communication system showing a receptacle cage and a gasket in accordance with an exemplary embodiment.
Figure 5:
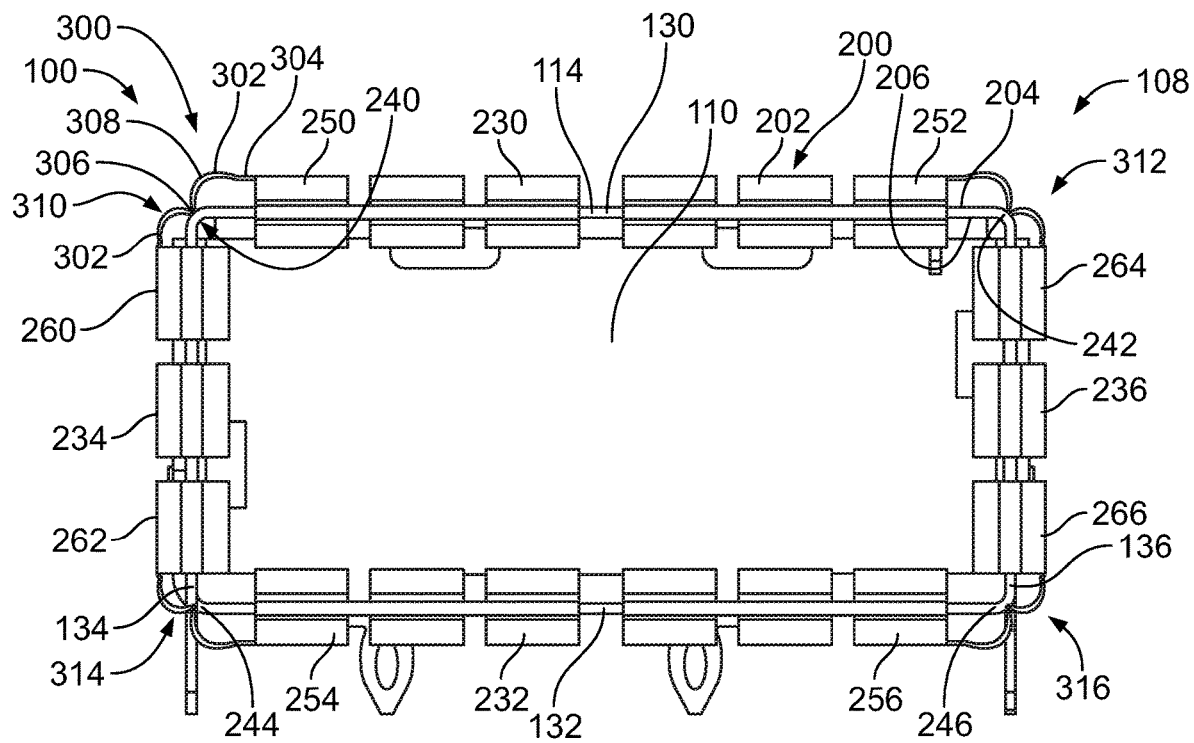
FIG. 5 is a front view of a portion of the communication system showing the receptacle cage and the gasket in accordance with an exemplary embodiment.
Figure 6:
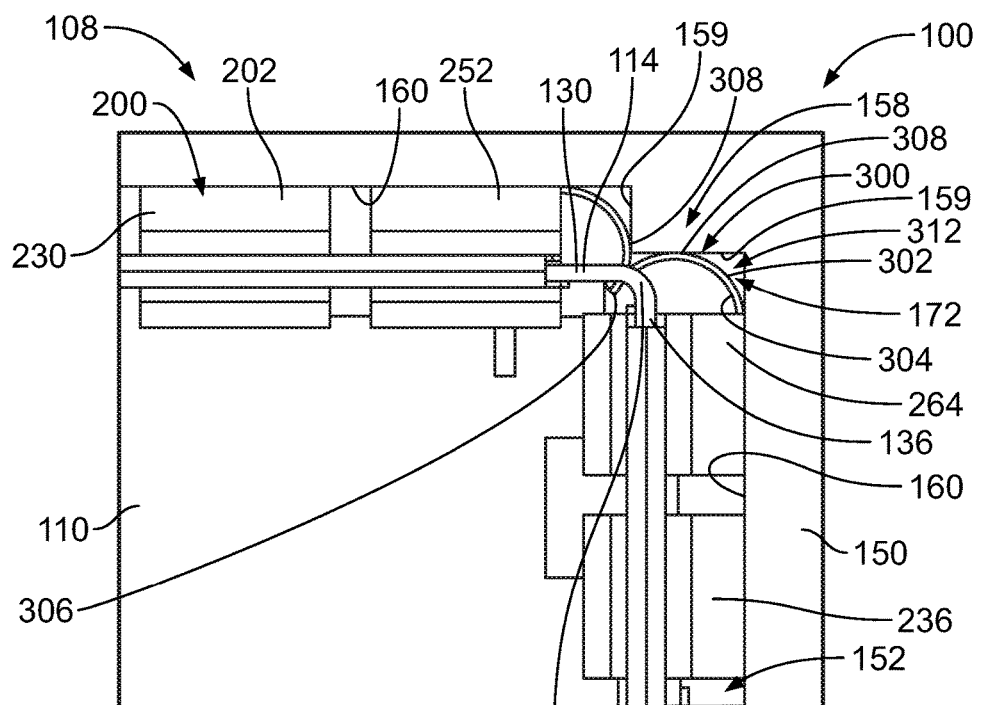
FIG. 6 is a front view of a portion of the communication system showing the receptacle cage and the gasket received in a panel opening of a panel in accordance with an exemplary embodiment.

FIG. 4 is a front perspective view of a portion of the communication system 100 showing the receptacle cage 110 and the gasket 200 in accordance with an exemplary embodiment. FIG. 5 is a front view of a portion of the communication system 100 showing the receptacle cage 110 and the gasket 200 in accordance with an exemplary embodiment. FIG. 6 is a front view of a portion of the communication system 100 showing the receptacle cage 110 and the gasket 200 received in the panel opening 152 of the panel 150 in accordance with an exemplary embodiment. FIGS. 4-6 illustrate the corner EMI springs 300 in accordance with an exemplary embodiment. The gasket 200 and corner EMI springs 300 are provided at the front end 140. In an exemplary embodiment, as shown in FIG. 6, the corner EMI springs 300 engage the panel 150 at the corners of the panel opening 152.

In various embodiments, the corner EMI springs 300 are integral with the gasket 200. For example, the corner EMI springs 300 are stamped and formed with the gasket 200. In other various embodiments, the corner EMI springs 300 may be integral with the receptacle cage 110, such as being stamped and formed from the cage walls 114. The corner EMI springs 300 are shaped differently than the EMI springs 202. The corner EMI springs 300 may extend transversely (for example, generally perpendicular) compared to the EMI springs 202.

The gasket 200 includes a plurality of the EMI springs 202, which are electrically connected to the cage walls 114 of the receptacle cage 110. The EMI springs 202 extend along the top wall 130 and/or the side walls 134, 136 and/or the bottom wall 132. In various embodiments, the gasket 200 may be discrete pieces coupled to each of the cage walls 114. Alternatively, the gasket 200 may be a single piece structure formed to extend along each of the cage walls 114. The EMI springs 202 are arranged side-by-side with gaps between adjacent EMI springs 202 to allow the EMI springs 202 to be independently movable. In various embodiments, the EMI springs 202 extend along exterior surfaces 204 of the cage walls 114, such as to engage the panel 150 (shown in FIGS. 1 and 2). The EMI springs 202 may additionally extend along interior surfaces 206 of the cage walls 114, such as to engage the pluggable module 106.

Each EMI spring 202 has a base 210 and a distal end 212 opposite the base 210 with a deflectable portion 214 between the base 210 and the distal end 212. In an exemplary embodiment, the distal end 212 engages the corresponding cage wall 114. For example, the distal end 212 may press against the cage wall 114 at one or more points of contact. In an exemplary embodiment, the deflectable portion 214 is curved between the base 210 and the distal end 212 such that the deflectable portion 214 is elevated off of the cage wall 114 to interface with the panel 150. The deflectable portion 214 is spaced apart from the cage wall 114 and is deflectable toward the cage wall 114, such as when engaging the panel 150 or the pluggable module 106. The base 210 is provided at the corresponding cage wall 114. Optionally, the base 210 may be integral with the cage wall 114, such as being stamped and formed from the cage wall 114. Alternatively, the base 210 may be coupled to the cage wall 114, such as being clipped to the cage wall 114, welded to the cage wall 114, or otherwise mechanically and electrically connected to the cage wall 114. In such embodiments, the bases 210 may be held together, such as by a common carrier strip, that is coupled to the cage wall 114 or alternatively, the bases 210 may be separate and discrete from each other, such as with each base 210 being individually coupled to the cage wall 114 (for example, being welded to the cage wall 114).

The deflectable portion 214 includes a mating interface 216 configured to engage the panel 150 or the pluggable module 106. The mating interface 216 may be provided at or near an apex of the curve of the deflectable portion 214. In an exemplary embodiment, the base 210 is fixed relative to the cage wall 114 while the distal end 212 is movable relative to the cage wall 114. For example, when the deflectable portion 214 is compressed, the EMI spring 202 is flattened out causing the distal end 212 to move rearwardly relative to the base 210 along the cage wall 114. In an exemplary embodiment, the EMI spring 202 remains supported at the base 210 and the distal end 212 such that the deflectable portion 214 is spring loaded against the panel 150 (or the pluggable module 106) when engaged therewith.

In an exemplary embodiment, the receptacle cage assembly 108 includes EMI springs 202 along all four sides of the receptacle cage 110, such as along the top wall 130, the bottom wall 132, and both side walls 134, 136. The EMI springs 202 along the top wall 130 define top EMI springs 230. The EMI springs 202 along the bottom wall 132 define bottom EMI springs 232. The EMI springs 202 along the first side wall 134 define first side EMI springs 234. The EMI springs 202 along the second side wall 136 define second side EMI springs 236.

The corner EMI springs 300 are arranged between the top EMI springs 230 and the first side EMI springs 234, between the top EMI springs 230 and the second side EMI springs 236, between the bottom EMI springs 232 and the first side EMI springs 234, and between the bottom EMI springs 232 and the second side EMI springs 236. The corner EMI springs 300 extend from the EMI springs 202 toward the corners of the receptacle cage 110. In an exemplary embodiment, the corner EMI springs 300 are provided at all four corners of the receptacle cage 110, such as at a first corner 240 between the top wall 130 and the first side wall 134, at a second corner 242 between the top wall 130 and the second side wall 136, at a third corner 244 between the bottom wall 132 and the first side wall 134, and at a fourth corner 246 between the bottom wall 132 and the second side wall 136. The corner EMI springs 300 include a first corner EMI spring 310 at the first corner 240, a second corner EMI spring 312 at the second corner 242, a third corner EMI spring 314 at the third corner 244, and a fourth corner EMI spring 316 at the fourth corner 246. The first corner EMI spring 310 is located to the left side of the top EMI springs 230 and above the first side EMI springs 234. The second corner EMI spring 312 is located to the right side of the top EMI springs 230 and above the second side EMI springs 236. The third corner EMI spring 314 is located to the left side of the bottom EMI springs 232 and below the first side EMI springs 234. The fourth corner EMI spring 316 is located to the right side of the bottom EMI springs 232 and below the second side EMI springs 236. The first corner EMI spring 310 extends into the first corner 170 (shown in FIG. 1) of the panel 150 to provide EMI shielding in the first corner 170. The second corner EMI spring 312 extends into the second corner 172 (shown in FIG. 1) of the panel 150 to provide EMI shielding in the second corner 172. The third corner EMI spring 314 extends into the third corner 174 (shown in FIG. 1) of the panel 150 to provide EMI shielding in the third corner 174. The fourth corner EMI spring 316 extends into the fourth corner 176 (shown in FIG. 1) of the panel 150 to provide EMI shielding in the fourth corner 176.

In an exemplary embodiment, the corner EMI springs 300 include discrete spring members 302 extending from corresponding EMI springs 202, such as from the outermost EMI springs 202 in each EMI spring group. In various embodiments, each corner EMI spring 300 is defined by a pair of the spring members 302. The spring members 302 may engage each other at the corresponding corner of the receptacle cage 110 and/or the corresponding corner of the panel 150. In an exemplary embodiment, each spring member 302 extends between a proximal end 304 and a distal end 306. The spring member 302 has a spring member mating interface 308 along the spring member 302 configured to engage the panel 150 (FIG. 6). The spring member mating interface 308 may be located at or near the distal end 306 in various embodiments. The spring member mating interface 308 may be located along the curved deflectable portion between the proximal end 304 and the distal end 306 in various embodiments. In an exemplary embodiment, the spring member mating interfaces 308 may be aligned (for example, coplanar) with the mating interfaces 216 of the deflectable portions 214, such as with the top EMI springs 230, the bottom EMI springs 232, the first side EMI springs 234, and the second side EMI springs 236.

In an exemplary embodiment, the top EMI springs 230 include a left-most top EMI spring 250 and a right-most top EMI spring 252. Each of the top EMI springs 250, 252 include corresponding spring members 302 extending therefrom. The bottom EMI springs 232 include a left-most bottom EMI spring 254 and a right-most bottom EMI spring 256. Each of the bottom EMI springs 254, 256 include corresponding spring members 302 extending therefrom. The first side EMI springs 234 include an upper-most first side EMI spring 260 and a lower-most first side EMI spring 262. Each of the first side EMI springs 260, 262 include corresponding spring members 302 extending therefrom. The second side EMI springs 236 include an upper-most second side EMI spring 264 and a lower-most second side EMI spring 266. Each of the second side EMI springs 264, 266 include corresponding spring members 302 extending therefrom. In an exemplary embodiment, the spring members 302 extending from the left-most top EMI spring 250 and the upper-most first side EMI spring 260 engage each other to define the first corner EMI spring 310. The spring members 302 extending from the right-most top EMI spring 252 and the upper-most second side EMI spring 264 engage each other to define the second corner EMI spring 312. The spring members 302 extending from the left-most bottom EMI spring 254 and the lower-most first side EMI spring 262 engage each other to define the third corner EMI spring 314. The spring members 302 extending from the right-most bottom EMI spring 256 and the lower-most second side EMI spring 266 engage each other to define the fourth corner EMI spring 316.

In an exemplary embodiment, the distal ends 306 of the spring members 302 engage the receptacle cage 110. The distal ends 306 of the spring members 302 may be received in slots 270 (FIG. 4) in the receptacle cage 110. The slots 270 may be provided in the corners 240, 242, 244, 246. The spring members 302 extend into the interior of the receptacle cage 110 through the slots 270. The spring members 302 engage the receptacle cage 110 at the slots 270.

In an exemplary embodiment, the spring members 302 are shaped to interface with the panel 150 at the panel opening 152. In an exemplary embodiment, the spring members 302 may include lead-ins to guide mating of the spring members 302 with the panel 150. As the spring members 302 engage the panel 150, the spring members 302 may be compressed inward toward the receptacle cage 110, such as to engage the receptacle cage 110. The spring members 302 may be convex or bowed outward between the proximal ends 304 and the distal ends 306 to interface with the panel 150.

In an exemplary embodiment, the panel opening 152 may include corner extensions 158 (shown in FIG. 6) extending into the panel opening 152. The corner extensions 158 are provided at the corners 170, 172, 174, 176 (shown in FIG. 1) of the panel 150. The corner extensions 158 extend toward the corners 240, 242, 244, 246 of the receptacle cage 110. The corner extensions 158 change the shape of the panel 150 at the corners 170, 172, 174, 176. For example, the corner extensions 158 extend inward from the panel edges 160 to change the shape of the panel opening 152 at the corners 170, 172, 174, 176. The corner extensions 158 fill at least part of the panel opening 152 for EMI shielding in the corners 170, 172, 174, 176. The corner extensions 158 may include extension edges 159 that define mating interfaces for the corner EMI springs 300. The corner extension 158 may include multiple extension edges 159, such as forming a right-angle corner extension. The corner extension 158 may include greater or fewer extension edges 159 having a different shape. For example, the corner extension 158 may include a single extension edge 159 between the panel edges 160, such as at a 45° angle or other angle between the panel edges 160.

Figure 7:
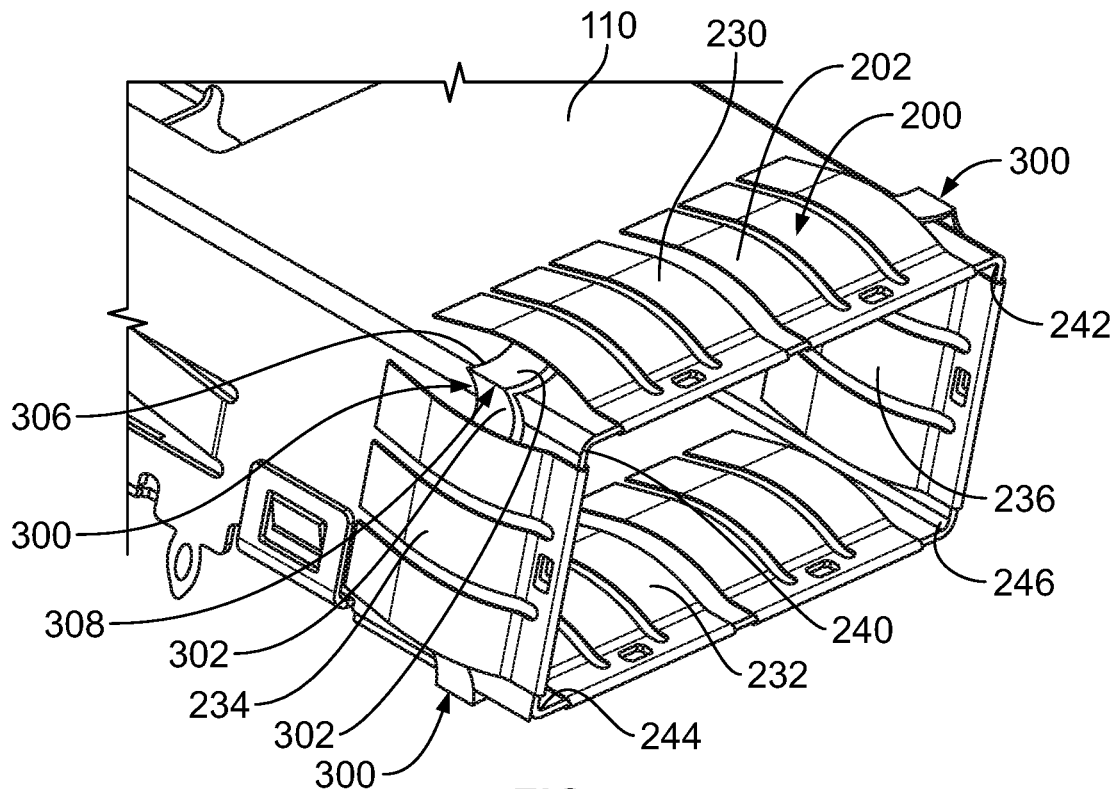
FIG. 7 is a front perspective view of the receptacle cage and the gasket with corner EMI springs in accordance with an exemplary embodiment.
Figure 8:
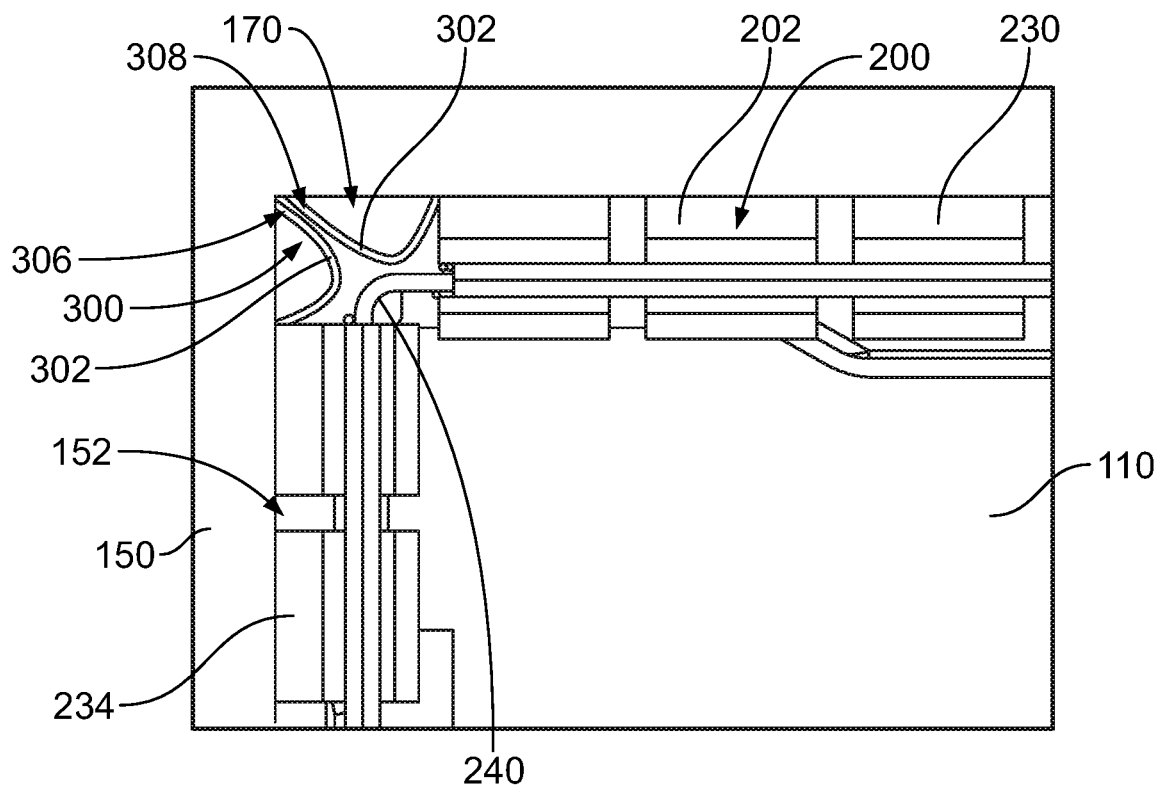
FIG. 8 is a front view of a portion of the receptacle cage and the gasket received in the panel opening of the panel with corner EMI springs in accordance with an exemplary embodiment.

FIG. 7 is a front perspective view of the receptacle cage 110 and the gasket 200 with the corner EMI springs 300 in accordance with an exemplary embodiment. FIG. 8 is a front view of a portion of the receptacle cage 110 and the gasket 200 received in the panel opening 152 of the panel 150 with the corner EMI springs 300 in accordance with an exemplary embodiment. In an exemplary embodiment, as shown in FIG. 8, the corner EMI springs 300 engage the panel 150 at the corners 170, 172, 174, 176 (shown in FIG. 1) of the panel opening 152. In the illustrated embodiment, the corner EMI springs 300 are shaped differently than the embodiment illustrated in FIGS. 4-6. For example, the corner EMI springs 300 shown in FIGS. 7-8 are inverted relative to the embodiment illustrated in FIGS. 4-6. The corner EMI springs 300 shown in FIGS. 7-8 are concave shaped as opposed to the convex corner EMI springs 300 shown in the embodiment illustrated in FIGS. 4-6.

The corner EMI springs 300 are arranged between the top EMI springs 230 and the first side EMI springs 234, between the top EMI springs 230 and the second side EMI springs 236, between the bottom EMI springs 232 and the first side EMI springs 234, and between the bottom EMI springs 232 and the second side EMI springs 236. The corner EMI springs 300 extend from the EMI springs 202 toward the corners 170, 172, 174, 176 (shown in FIG. 1) of the panel 150. The corner EMI springs 300 are configured to engage the panel 150 at the corners 170, 172, 174, 176.

In an exemplary embodiment, the spring members 302 of the corner EMI springs 300 extend from the corresponding EMI springs 202 to engage the panel 150. The spring members 302 may engage each other at the corresponding corner 170, 172, 174, 176 of the panel 150. In an exemplary embodiment, the distal ends 306 of the spring members 302 engage each other, such as at the corners 170, 172, 174, 176. The distal ends 306 may define the spring member mating interfaces 308 that engage the panel 150.

In an exemplary embodiment, the spring members 302 may be compressed between the EMI springs 202 and the panel 150 to engage the receptacle cage 110, such as at the corners 240, 242, 244, 246. The spring members 302 may include lead-ins to guide mating of the spring members 302 with the panel 150. As the spring members 302 engage the panel 150, the spring members 302 may be compressed inward toward the receptacle cage 110, such as to engage the receptacle cage 110.

Figure 9:
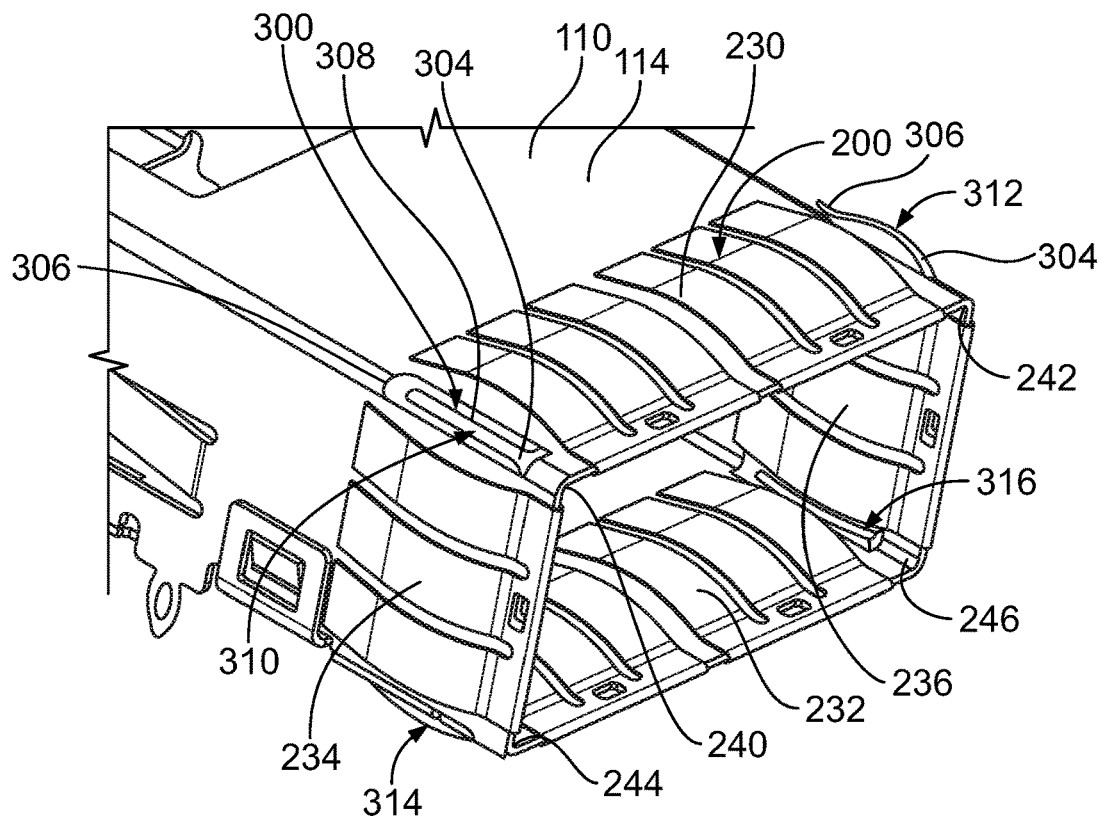
FIG. 9 is a front perspective view of the receptacle cage and the gasket with corner EMI springs in accordance with an exemplary embodiment.
Figure 10:
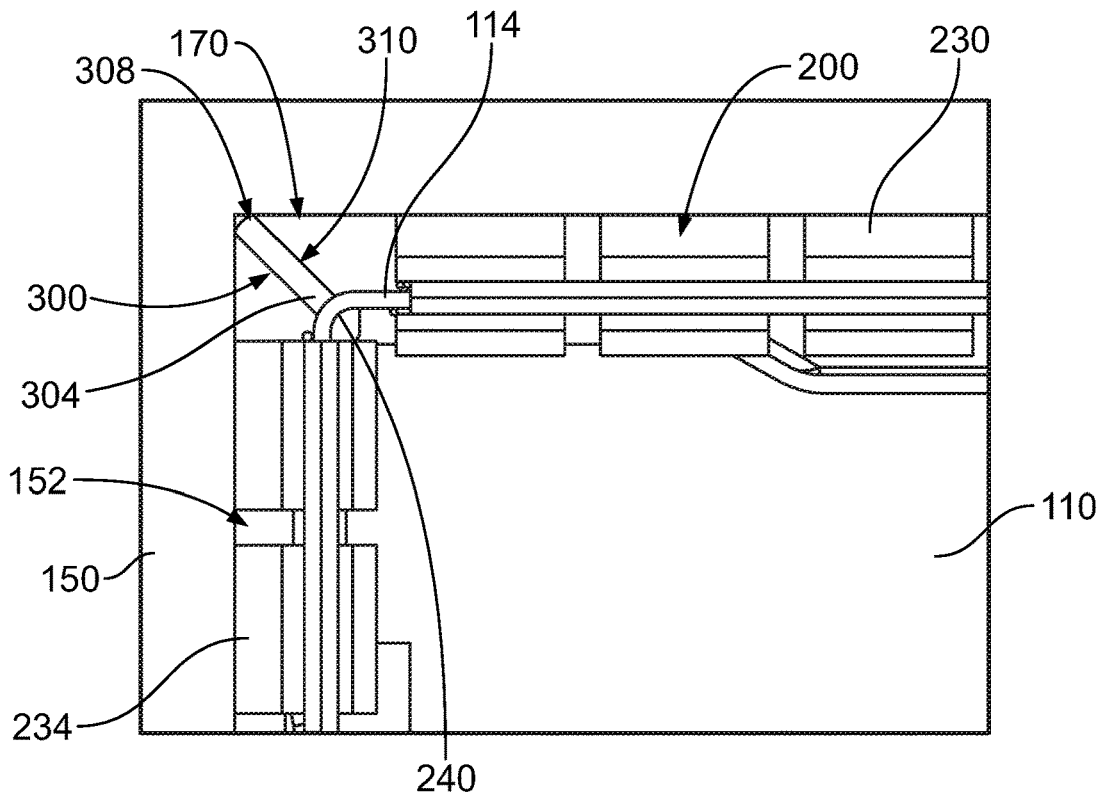
FIG. 10 is a front view of a portion of the receptacle cage and the gasket received in the panel opening of the panel with corner EMI springs in accordance with an exemplary embodiment.

FIG. 9 is a front perspective view of the receptacle cage 110 and the gasket 200 with the corner EMI springs 300 in accordance with an exemplary embodiment. FIG. 10 is a front view of a portion of the receptacle cage 110 and the gasket 200 received in the panel opening 152 of the panel 150 with the corner EMI springs 300 in accordance with an exemplary embodiment. In an exemplary embodiment, as shown in FIG. 8, the corner EMI springs 300 are integral with the receptacle cage 110 and extend from the receptacle cage 110 to engage the panel 150 at the corners 170, 172, 174, 176 (shown in FIG. 1) of the panel opening 152. In the illustrated embodiment, the corner EMI springs 300 are shaped differently than the embodiment illustrated in FIGS. 4-6 and the embodiment illustrated in FIG. 7-8.

The corner EMI springs 300 are arranged between the top EMI springs 230 and the first side EMI springs 234, between the top EMI springs 230 and the second side EMI springs 236, between the bottom EMI springs 232 and the first side EMI springs 234, and between the bottom EMI springs 232 and the second side EMI springs 236. The corner EMI springs 300 extend from the receptacle cage 110, such as one or more cage walls 114. The corner EMI springs 300 are provided at the corners 240, 242, 244, 246. The corner EMI springs 300 may be stamped from the cage walls 114 and formed into a spring beam shape. The corner EMI springs 300 extend from the corners 240, 242, 244, 246 toward the corners 170, 172, 174, 176 of the panel 150. The proximal ends 304 are fixed at the cage walls 114 and the distal ends 306 are free to move relative to the cage walls 114. The corner EMI springs 300 may be integral with the cage walls 114 (for example, stamped and formed from the cage walls) or, alternatively, may be separate from the cage walls 114, such as being clipped onto the cage walls 114. The corner EMI spring member mating interfaces 308 are configured to directly engage the panel 150, such as at the corners 170, 172, 174, 176. For example, the first corner EMI spring 310 is located to the left side of the top EMI springs 230 and above the first side EMI springs 234. The second corner EMI spring 312 is located to the right side of the top EMI springs 230 and above the second side EMI springs 236. The third corner EMI spring 314 is located to the left side of the bottom EMI springs 234 and below the first side EMI springs 234. The fourth corner EMI spring 316 is located to the right side of the bottom EMI springs 234 and below the second side EMI springs 236. The first corner EMI spring 310 extends into the first corner 170 (shown in FIG. 1) of the panel 150 to provide EMI shielding in the first corner 170. The second corner EMI spring 312 extends into the second corner 172 (shown in FIG. 1) of the panel 150 to provide EMI shielding in the second corner 172. The third corner EMI spring 314 extends into the third corner 174 (shown in FIG. 1) of the panel 150 to provide EMI shielding in the third corner 174. The fourth corner EMI spring 316 extends into the fourth corner 176 (shown in FIG. 1) of the panel 150 to provide EMI shielding in the fourth corner 176.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle cage assembly for a communication system comprising:

a receptacle cage having cage walls including a top wall, a first side wall extending from the top wall at a first corner, and a second side wall extending from the top wall at a second corner opposite the first corner, the top wall, the first side wall, and the second side wall forming a module channel configured to receive a pluggable module, the cage walls extending between a front end and a rear end of the receptacle cage, the receptacle cage configured to be received in a panel opening of a panel with the front end forward of the panel and the rear end rearward of the panel, the module channel receiving the pluggable module at the front end;

a gasket at the front end, the gasket having EMI springs electrically connected to the receptacle cage and configured to be electrically connected to the panel in the panel opening, the EMI springs including top EMI springs electrically connected to the top wall, the EMI springs having first side EMI springs electrically connected to the first side wall, the EMI springs having second side EMI springs electrically connected to the second side wall, each EMI spring having a base and a distal end opposite the base with a deflectable portion between the base and the distal end, the base provided at the corresponding cage wall, the distal end engaging the corresponding cage wall, the deflectable portion being spaced apart from the cage wall and being deflectable toward the cage wall;

a first corner EMI spring located outward of the first corner of the receptacle cage, the first corner EMI spring shaped differently than the top EMI springs and shaped differently than the first side EMI springs, the first corner EMI spring having a first corner EMI spring mating interface configured to engage the panel at a first corner of the panel opening.

2. The receptacle cage assembly of claim 1, further comprising a second corner EMI spring located outward of the second corner of the receptacle cage, the second corner EMI spring shaped differently than the top EMI springs and shaped differently than the second side EMI springs, the second corner EMI spring having a second corner EMI spring mating interface configured to engage the panel at a second corner of the panel opening, wherein the first corner EMI spring is located between the top EMI springs and the first side EMI springs, and wherein the second corner EMI spring is located between the top EMI springs and the second side EMI springs.

3. The receptacle cage assembly of claim 1, further comprising a second corner EMI spring located outward of the second corner of the receptacle cage, the second corner EMI spring having a second corner EMI spring mating interface configured to engage the panel at a second corner of the panel opening, wherein the first corner EMI spring is configured to engage the panel in the panel opening to a left side of the top EMI springs and above the first side EMI springs, and wherein the second corner EMI spring is configured to engage the panel in the panel opening to a right side of the top EMI springs and above the second side EMI springs.

4. The receptacle cage assembly of claim 1, further comprising a second corner EMI spring located outward of the second corner of the receptacle cage, the second corner EMI spring having a second corner EMI spring mating interface configured to engage the panel at a second corner of the panel opening, wherein the first corner EMI spring mating interface and the second corner EMI spring mating interface are aligned with the deflectable portions of the EMI springs to engage the panel.

5. The receptacle cage assembly of claim 1, wherein the first corner EMI spring extends from at least one of the top EMI springs and the first side EMI springs.

6. The receptacle cage assembly of claim 1, wherein the first corner EMI spring extends between a proximal end and a distal end, the proximal end of the first corner EMI spring extending from at least one of the top EMI springs and the first side EMI springs, the distal end of the first corner EMI spring engaging the receptacle cage.

7. The receptacle cage assembly of claim 1, further comprising a second corner EMI spring located outward of the second corner of the receptacle cage, the second corner EMI spring having a second corner EMI spring mating interface configured to engage the panel at a second corner of the panel opening, wherein the first corner EMI spring includes a first spring member extending from a left-most top EMI spring and a second spring member extending from an upper-most first side EMI spring, and wherein the second corner EMI spring includes a third spring member extending from a right-most top EMI spring and a fourth spring member extending from an upper-most second side EMI spring.

8. The receptacle cage assembly of claim 7, wherein a distal end of the first spring member engages a distal end of the second spring member, the distal end of the first spring member and the distal end of the second spring member engaging the receptacle cage, and wherein a distal end of the third spring member engages a distal end of the fourth spring member, the distal end of the third spring member and the distal end of the fourth spring member engaging the receptacle cage.

9. The receptacle cage assembly of claim 7, wherein a distal end of the first spring member engages a distal end of the second spring member, the distal end of the first spring member and the distal end of the second spring member are configured to engage the first corner of the panel, and wherein a distal end of the third spring member engages a distal end of the fourth spring member, the distal end of the third spring member and the distal end of the fourth spring member are configured to engage the second corner of the panel.

10. The receptacle cage assembly of claim 1, wherein the first corner EMI spring is integral with the receptacle cage, the first corner EMI spring including a proximal end and a distal end, the proximal end of the first corner EMI spring extending from at least one of the top wall or the first side wall at the first corner.

11. A receptacle cage assembly for a communication system comprising:

a receptacle cage having cage walls including a top wall, a first side wall extending from the top wall at a first corner, and a second side wall extending from the top wall at a second corner opposite the first corner, the top wall, the first side wall, and the second side wall forming a module channel configured to receive a pluggable module, the cage walls extending between a front end and a rear end of the receptacle cage, the receptacle cage configured to be received in a panel opening of a panel with the front end forward of the panel and the rear end rearward of the panel, the receptacle cage including a first corner EMI spring integral with the cage walls as a unitary structure and located outward of the first corner, the receptacle cage including a second corner EMI spring integral with the cage walls as a unitary structure and located outward of the second corner, the first corner EMI spring having a first corner EMI spring mating interface configured to engage the panel at a first corner of the panel opening, the second corner EMI spring having a second corner EMI spring mating interface configured to engage the panel at a second corner of the panel opening; and a gasket at the front end, the gasket having EMI springs electrically connected to the receptacle cage and configured to be electrically connected to the panel in the panel opening, the EMI springs including top EMI springs electrically connected to the top wall, the EMI springs having first side EMI springs electrically connected to the first side wall, the EMI springs having second side EMI springs electrically connected to the second side wall, each EMI spring having a base and a distal end opposite the base with a deflectable portion between the base and the distal end, the base provided at the corresponding cage wall, the distal end engaging the corresponding cage wall, the deflectable portion being spaced apart from the cage wall and being deflectable toward the cage wall;

wherein the first corner EMI spring is located between the first side EMI springs and the top EMI springs, and wherein the second corner EMI spring is located between the second side EMI springs and the top EMI springs.

12. The receptacle cage assembly of claim 11, wherein the first corner EMI spring is angled relative to the top EMI springs and angled relative to the first side EMI springs, and wherein the second corner EMI spring is angled relative to the top EMI springs and angled relative to the second side EMI springs.

13. The receptacle cage assembly of claim 11, wherein the first corner EMI spring is integral with the receptacle cage, the first corner EMI spring including a proximal end and a distal end, the proximal end of the first corner EMI spring extending from at least one of the top wall or the first side wall at the first corner, and wherein the second corner EMI spring is integral with the receptacle cage, the second corner EMI spring including a proximal end and a distal end, the proximal end of the second corner EMI spring extending from at least one of the top wall or the second side wall at the second corner.

14. A receptacle cage assembly for a communication system comprising:
a receptacle cage having cage walls including a top wall, a first side wall extending from the top wall at a first corner, and a second side wall extending from the top wall at a second corner opposite the first corner, the top wall, the first side wall, and the second side wall forming a module channel configured to receive a pluggable module, the cage walls extending between a front end and a rear end of the receptacle cage, the receptacle cage configured to be received in a panel opening of a panel with the front end forward of the panel and the rear end rearward of the panel, the module channel receiving the pluggable module at the front end;
a gasket at the front end, the gasket having EMI springs electrically connected to the receptacle cage and configured to be electrically connected to the panel in the panel opening, the EMI springs including top EMI springs electrically connected to the top wall, the top EMI springs including a left-most top EMI spring and a right-most top EMI spring, the EMI springs having first side EMI springs electrically connected to the first side wall, the first side EMI springs including an upper-most first side EMI spring, the EMI springs having second side EMI springs electrically connected to the second side wall, the second side EMI springs including an upper-most second side EMI spring, each EMI spring having a base and a distal end opposite the base with a deflectable portion between the base and the distal end, the base provided at the corresponding cage wall, the distal end engaging the corresponding cage wall, the deflectable portion being spaced apart from the cage wall and being deflectable toward the cage wall;
a first corner EMI spring located outward of the first corner of the receptacle cage, the first corner EMI spring including a first spring member extending from the left-most top EMI spring and a second spring member extending from the upper-most first side EMI spring, the first spring member having a first spring member mating interface configured to engage the panel at a first corner of the panel opening, the second spring member having a second spring member mating interface configured to engage the panel at the first corner of the panel opening; and
a second corner EMI spring located outward of the second corner of the receptacle cage, the second corner EMI spring including a third spring member extending from the right-most top EMI spring and a fourth spring member extending from the upper-most second side EMI spring, the third spring member having a third spring member mating interface configured to engage the panel at a second corner of the panel opening, the fourth spring member having a fourth spring member mating interface configured to engage the panel at the second corner of the panel opening.

15. The receptacle cage assembly of claim 14, wherein a distal end of the first spring member engages a distal end of the second spring member, the distal end of the first spring member and the distal end of the second spring member engaging the receptacle cage, and wherein a distal end of the third spring member engages a distal end of the fourth spring member, the distal end of the third spring member and the distal end of the fourth spring member engaging the receptacle cage.

16. The receptacle cage assembly of claim 14, wherein a distal end of the first spring member engages a distal end of the second spring member, the distal end of the first spring member and the distal end of the second spring member are configured to engage the first corner of the panel, and wherein a distal end of the third spring member engages a distal end of the fourth spring member, the distal end of the third spring member and the distal end of the fourth spring member are configured to engage the second corner of the panel.

17. A communication system comprising:
a panel having a front surface and a rear surface, the panel having a panel opening including an upper edge, a first side edge, a second side edge and a lower edge, the first and second side edges extending between the upper edge and the lower edge, the panel opening having a first corner at the intersection of the first side edge and the upper edge and a second corner at the intersection of the second side edge and the upper edge;
a receptacle cage having cage walls including a top wall, a first side wall extending from the top wall at a first corner received in the first corner of the panel opening, and a second side wall extending from the top wall at a second corner received in the second corner of the panel opening, the top wall, the first side wall, and the second side wall forming a module channel configured to receive a pluggable module, the cage walls extending between a front end and a rear end of the receptacle cage, the receptacle cage received in the panel opening with the front end forward of the front surface of the panel and the rear end rearward of the rear surface of the panel;
a gasket at the front end, the gasket having EMI springs electrically connected to the receptacle cage and electrically connected to the panel in the panel opening, the EMI springs including top EMI springs electrically connected to the top wall and engaging the upper edge of the panel, the EMI springs having first side EMI springs electrically connected to the first side wall and engaging the first side edge of the panel, the EMI springs having second side EMI springs electrically connected to the second side wall and engaging the second side edge of the panel, each EMI spring having a base and a distal end opposite the base with a deflectable portion between the base and the distal end, the base provided at the corresponding cage wall, the distal end engaging the corresponding cage wall, the deflectable portion being spaced apart from the cage wall and being deflectable toward the cage wall;
- a first corner EMI spring located outward of the first corner of the receptacle cage, the first corner EMI spring having a first corner EMI spring mating interface engaging the first corner of the panel; and
- a second corner EMI spring located outward of the second corner of the receptacle cage, the second corner EMI spring having a second corner EMI spring mating interface engaging the second corner of the panel.

18. The communication system of claim 17, wherein the panel includes a first corner extension extending into the panel opening at the first corner, the first corner EMI spring engages the first corner extension, and wherein the panel includes a second corner extension extending into the panel opening at the second corner, the second corner EMI spring engages the second corner extension.

19. The communication system of claim 17, wherein the panel opening includes a third corner at the intersection of the first side edge and the lower edge and a fourth corner at the intersection of the second side edge and the lower edge, the cage walls of the receptacle cage including a bottom wall meeting the first side wall at a third corner received in the third corner of the panel opening and the bottom wall meeting the second side wall at a fourth corner received in the fourth corner of the panel opening, the EMI springs of the gasket including bottom EMI springs electrically connected to the bottom wall and engaging the lower edge of the panel, the communication system further comprising a third corner EMI spring located outward of the third corner of the receptacle cage, the third corner EMI spring having a third corner EMI spring mating interface engaging the panel at the third corner of the panel, the communication system further comprising a fourth corner EMI spring located outward of the fourth corner of the receptacle cage, the fourth corner EMI spring having a fourth corner EMI spring mating interface engaging the panel at the fourth corner of the panel.

* * * * *